US011262089B2

(12) United States Patent
Magcale (10) Patent No.: US 11,262,089 B2
(45) Date of Patent: Mar. 1, 2022

(54) DATA CENTER MANAGEMENT SYSTEMS AND METHODS FOR COMPUTE DENSITY EFFICIENCY MEASUREMENTS

(71) Applicant: Nautilus Data Technologies, Inc., Pleasanton, CA (US)

(72) Inventor: Arnold Castillo Magcale, San Ramon, CA (US)

(73) Assignee: Nautilus TRUE, LLC, San Ramon, CA (US)

( * ) Notice: Subject to any disclaimer, the term of this patent is extended or adjusted under 35 U.S.C. 154(b) by 110 days.

(21) Appl. No.: 16/248,770

(22) Filed: Jan. 16, 2019

(65) Prior Publication Data

US 2019/0145645 A1    May 16, 2019

Related U.S. Application Data

(63) Continuation of application No. 14/591,572, filed on Jan. 7, 2015, now abandoned, which is a continuation of application No. 15/283,097, filed on Sep. 30, 2016, now Pat. No. 10,216,606, which is a continuation of application No. 15/970,160, filed on May 3, 2018, now Pat. No. 10,673,684.

(60) Provisional application No. 61/925,531, filed on Jan. 9, 2014.

(51) Int. Cl.
*G05B 21/00* (2006.01)
*F24F 11/30* (2018.01)
*H05K 7/20* (2006.01)
*G06F 9/455* (2018.01)

(52) U.S. Cl.
CPC .......... *F24F 11/30* (2018.01); *H05K 7/20836* (2013.01); *G06F 2009/45591* (2013.01)

(58) Field of Classification Search
CPC .................. H05K 7/20836; G06F 2009/45591
See application file for complete search history.

(56) References Cited

U.S. PATENT DOCUMENTS

| | | | |
|---|---|---|---|
| 9,438,466 B1* | 9/2016 | O'Gorman | H04L 41/12 |
| 2009/0050591 A1* | 2/2009 | Hart | G06F 1/206 |
| | | | 211/162 |
| 2014/0039683 A1* | 2/2014 | Zimmermann | G06F 1/329 |
| | | | 700/275 |

* cited by examiner

*Primary Examiner* — Wissam Rashid
(74) *Attorney, Agent, or Firm* — Michael D. Eisenberg (57) ABSTRACT

Embodiments disclosed include data center infrastructure management (DCIM) systems and methods configured to, collect data center compute systems, power systems, and facility systems data, trigger an action or actions based on a diagnosed or predicted condition according to the collected data, and thereby control via a compute, power, and facilities module, the compute systems, power systems and facility systems in the data center. According to an embodiment, the control via the compute, power, and facilities module comprises calibrating the compute, power, and facility systems based on an estimated compute requirement, and an associated power, cooling, and network data resource requirement. The estimated compute requirement comprises estimating compute density per real-time power wattage, and storage density per real-time power wattage.

9 Claims, 7 Drawing Sheets

DATA CENTER MANAGEMENT SYSTEMS AND METHODS FOR COMPUTE DENSITY EFFICIENCY MEASUREMENTS

CROSS REFERENCE TO RELATED APPLICATIONS

This application is a continuation of application Ser. No. 14/591,572 filed 7 Jan. 2015, entitled "A DATA CENTER INFRASTRUCTURE MANAGEMENT (DCIM) SYSTEM WITH PREDICTIVE ANALYTICS" which claims the benefit of provisional application No. 61/925,531 having a filing date of Jan. 9, 2014, and is further a continuation of application Ser. No. 15/283,097 filed 30 Sep. 2016 entitled "DATA CENTER MANAGEMENT SYSTEMS AND METHODS FOR COMPUTE DENSITY EFFICIENCY MEASUREMENTS" the contents of which are incorporated by reference in their entirety.

BACKGROUND OF THE INVENTION

Field

The present invention relates to infrastructure management systems, especially with respect to data center facilities, but not restricted to the said data center facilities.

Related Art

Data centers and co-location providers in particular struggle with both supplying requisite power as well as cooling. As data center density continues to increase there is a growing demand for more energy efficient and cost effective data centers and co-location solutions.

A data center is a facility used to house computer systems and associated components. To serve this purpose, a data center is designed to maintain an ambient condition suitable for proper operation of the computer systems therein. Normally, in order to sustain the functioning of the system therein, a data center will consume more than twice the power that is needed due to the inefficiency of the cooling systems. Heat created by the system is disproportional to the resources it consumes for operation. Due to the unpredictability of the real-time computing power consumption, the heat generated by the system is hard to track too.

As data centers become increasingly complicated in structure and functions, their system's utilization of energy especially for cooling and operations have grown radically. As a result, increasing the energy-efficiency and reducing the resource consumption of the data centers becomes vital to long term sustenance of data center facilities.

Traditional data centers face challenges with technical innovation, operational efficiency and modern design principles. With increasingly complex environments such challenges with energy-efficiency and resource utilization management have become vital to long term sustainment of data center facilities. Current data center providers struggle to monitor infrastructure systems, collect data from infrastructure systems and manage infrastructure systems to allow optimal efficiency of the data center facility.

Traditional data centers are built with physical infrastructure that is static in nature. When this constrained static infrastructure is placed under dynamic workloads, it can expose significant infrastructure inefficiencies. These inefficiencies may only be addressed through continuous collection and analysis of data center infrastructure and environmental data.

The described DCIM system comprising predictive analytics may be employed to continuously collect and analyze infrastructure system, component, and environmental data. The DCIM system comprising predictive analytics may identify inefficiencies or previously unknown interdependencies. The continuous collection and analysis of infrastructure and environmental data enables automated management of infrastructure systems and components to sustain optimal infrastructure efficiencies.

Prior art systems and methods have attempted to develop multi-metric views that provide a broader understanding of data center cooling performance. These multi-metric views attempt to take into account aspects of performance by bringing together the Power Usage Effectives (PUE) ratio, IT Thermal Conformance and IT Thermal Resilience. However, there still remains a need for a more nuanced and multi-dimensional metric that address the most critical aspects of a data center's cooling performance. In order to establish a more complete view of facility cooling, the requirement to calculate cooling effectiveness and the data center's future thermal state is also critical. There remains an additional need for a multi-dimensional metric that is easily scalable and that can accommodate additional new metrics in the future, as they are defined. Embodiments disclosed address precisely such a need.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a data center infrastructure management (DCIM) system configured to: over a network, collect data center compute systems, power systems, and facility systems data; based on the data collected, trigger an action according to a diagnosed or predicted condition of the compute systems, power systems and facility systems; control via a compute, power, and facilities module, the compute systems, power systems and facility systems in the data center; wherein the control via the compute, power, and facilities module includes calibrating the compute, power, and facility systems based on an estimated compute requirement, and an associated power, cooling, and network data resource requirement; and wherein the estimated compute requirement includes estimating compute density per real-time power wattage, and storage density per real-time power wattage. Other embodiments of this aspect include corresponding computer systems, apparatus, and computer programs recorded on one or more computer storage devices, each configured to perform the actions of the methods.

One general aspect includes in a data center infrastructure management (DCIM) system including a processing unit coupled to a memory element, and having instructions encoded thereon, a method including: over a network, collecting data center compute systems, power systems, and facility systems data; based on the collected data, triggering an action according to a diagnosed or predicted condition of the compute systems, power systems and facility systems; controlling via a compute, power, and facilities module, the compute systems, power systems and facility systems in the data center; wherein the controlling via the compute, power, and facilities module comprises calibrating the compute, power, and facility systems based on an estimated compute requirement, and an associated power, cooling, and network data resource requirement; and wherein the estimated compute requirement includes estimating compute density per real-time power wattage, and storage density per real-time power wattage. Other embodiments of this aspect include corresponding computer systems, apparatus, and computer programs recorded on one or more computer storage devices, each configured to perform the actions of the methods.

A system for data center infrastructure management comprising a processing unit coupled to a memory element, and having instructions encoded thereon, wherein the encoded instructions cause the system to: collect and store data center infrastructure system condition data, environmental condition data and component condition data; analyze the collected infrastructure system, environmental and component condition data; and based on the collected and analyzed data, automatically make zero or more adjustments to data center infrastructure system condition, environmental condition and component condition.

In a system for data center infrastructure management comprising a processing unit coupled to a memory element, and having instructions encoded thereon, a method comprising: collecting and storing data center infrastructure system condition data, environmental condition data and component condition data; analyzing the collected infrastructure system, environmental and component condition data; and based on the collected and analyzed data, automatically making zero or more adjustments to data center infrastructure system condition, environmental condition and component condition.

A system for data center infrastructure management comprising a processing unit coupled to a memory element, and having instructions encoded thereon, wherein the encoded instructions cause the system to: collect and store data center infrastructure system condition data, environmental condition data and component condition data; analyze the collected infrastructure system, environmental and component condition data; and based on the collected and analyzed data, automatically make zero or more adjustments to data center infrastructure system condition, environmental condition and component condition; wherein the said zero or more adjustments are based on a predictive analytics functionality configured to continuously collect and analyze data, and wherein the predictive analytics functionality is further configured to implement predictive analytics of a single or plurality of virtual machines, an instance or instances over a cloud computing network, and to estimate demand for the said virtual machines and cloud instances; and wherein the analytics for demand comprises: estimating a baseline of virtual machine or cloud demands based on collected real-time and historical demand data; estimating a baseline of virtual machine or cloud status based on collected real-time and historical demand data; predicting future status and demand based on predictive modeling which further comprises the collected real-time estimations; and based on the predictive modeling and analytics, dynamically implementing an action or actions.

In a system for data center infrastructure management comprising a processing unit coupled to a memory element, and having instructions encoded thereon, a method comprising: collecting and storing data center infrastructure system condition data, environmental condition data and component condition data; analyzing the collected infrastructure system, environmental and component condition data; and based on the collected and analyzed data, automatically making zero or more adjustments to data center infrastructure system condition, environmental condition and component condition; wherein the said zero or more adjustments are based on a predictive analytics functionality configured for continuously collecting and analyzing data, and wherein the predictive analytics functionality is further configured to implement predictive analytics of a single or plurality of virtual machines, an instance or instances over a cloud computing network, and to estimate demand for the said virtual machines and cloud instances; and wherein the analytics for demand comprises: estimating a baseline of virtual machine or cloud demands based on collected real-time and historical demand data; estimating a baseline of virtual machine or cloud status based on collected real-time and historical demand data; predicting future status and demand based on predictive modeling which further comprises the collected real-time estimations; and based on the predictive modeling and analytics, dynamically implementing an action or actions.

DETAILED DESCRIPTION

The following is a detailed description of embodiments of the invention depicted in the accompanying drawings. The embodiments are introduced in such detail as to clearly communicate the invention. However, the embodiment(s) presented herein are merely illustrative, and are not intended to limit the anticipated variations of such embodiments; on the contrary, the intention is to cover all modifications, equivalents, and alternatives falling within the spirit and scope of the appended claims. The detailed descriptions below are designed to make such embodiments obvious to those of ordinary skill in the art.

As stated above, the traditional way of monitoring data center infrastructure, collecting data from infrastructure systems, and managing the systems to allow maximizing the operational efficiency is now struggling to cope with new challenges brought by the growing complexity of data centers. Embodiments disclosed include systems and methods that address these challenges effectively and efficiently.

Embodiments disclosed include a Data Center Infrastructure Management (DCIM) system employed to continuously diagnose and predict the condition of compute systems, power systems, and facility systems to enable automated estimation of compute requirement, and to optimize the operation of the data center system by using metrics which could allow the operator to further accommodate other considering Performance Indicators if needed.

Embodiments disclosed are different from, and superior to what currently exists. Embodiments disclosed included methods and systems for data center infrastructure management and data center operation. According to an embodiment, the Data Center Infrastructure Management System comprises estimation of the compute requirement of the data center described in this document, and metrics that can further accommodate other Performance Indicators, which are beyond the scope of existing systems.

The Data Center Infrastructure Management (DCIM) system described may be employed to provide continuous monitoring and analysis of data to enable automated management of data center mechanical, electrical and cooling infrastructure to maintain optimal infrastructure efficiency.

Embodiments disclosed include a new and improved method and system for infrastructure management and control, and more particularly for data center infrastructure management and control. According to an embodiment, the Data Center Infrastructure Management System (DCIM) system comprises predictive analytics described in this document, which is beyond the scope of existing systems. The ability to automate infrastructure management through collected data and predictive analytics provides a clear advantage to what currently exists.

Data center infrastructure is constrained and static in nature. The inefficiencies of such constrained static design are quickly exposed when placed under a dynamic load. Without continuous collection and analysis of infrastructure and environmental data, management of data center infrastructure systems and components is a hit and miss proposition. These limitations cause inefficient power consumption and prohibit automated management of data center infrastructure.

The described DCIM system comprising predictive analytics may be employed to continuously collect and analyze infrastructure system, component, and environmental data. The DCIM system comprising predictive analytics may identify inefficiencies or previously unknown interdependencies. The continuous collection and analysis of infrastructure and environmental data enables automated management of infrastructure systems and components to sustain optimal infrastructure efficiencies. Alternatively and additionally, embodiments of this invention can continuously monitor, collect and analyze data to automate management of virtual machine resources across a data center or data centers, wherein the monitoring, collecting, analyzing and control can be performed onsite, or remotely in a centralized fashion.

Figure 1:
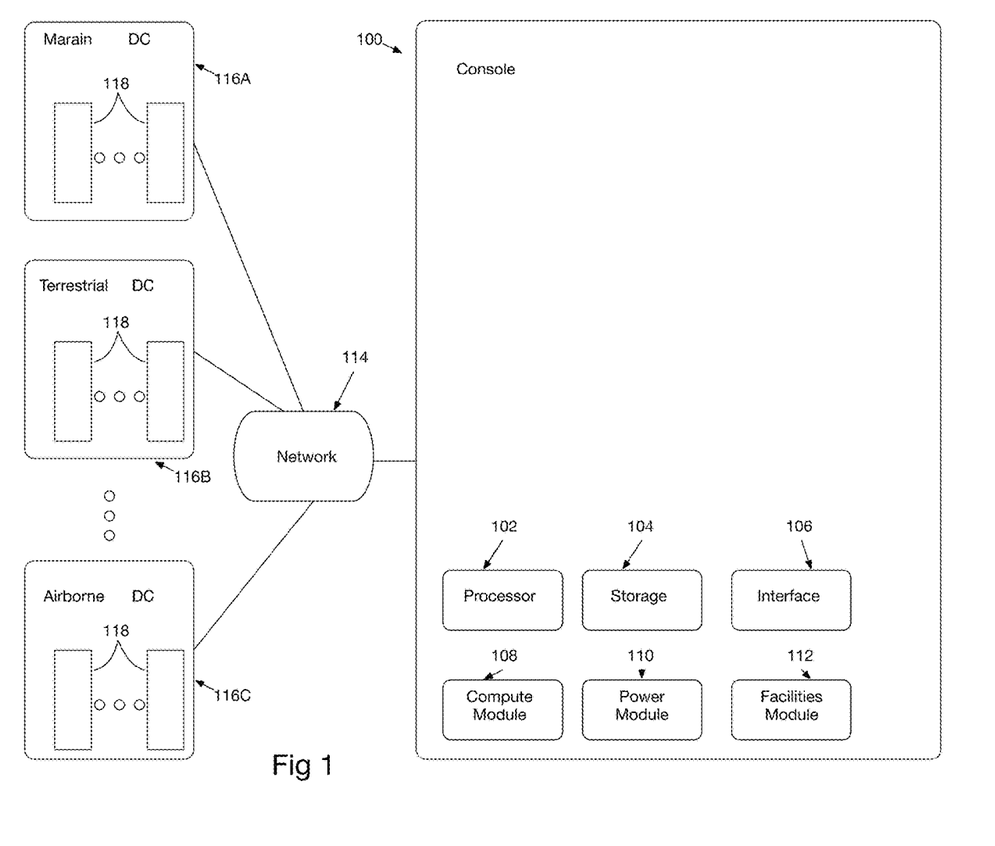
FIG. 1 illustrates an embodiment of the DCIM system.

FIG. 1 illustrates an embodiment of the Data Center Infrastructure Management (DCIM) System. The illustrated embodiment includes a processing unit 100 coupled to a memory element 104, and having instructions encoded thereon, configured to: over a network 114, collect compute systems data, power systems data, and facility systems data from data centers 116A, 116B, and 116C. The disclosed embodiment is configured to trigger an action based on a diagnosed or predicted condition of the collected compute systems, power systems and facility systems. According to an embodiment, the configuration enables control of the compute systems, power systems and facility systems in each of the illustrated data centers via a corresponding centralized compute module 108, power module 110, and facilities module 112. Preferably, the control via the compute, power, and facilities module comprises calibrating the compute, power, and facility systems based on an estimated compute requirement, and an associated power, cooling, and network data resource requirement. According to an embodiment, the estimated compute requirement comprises estimating compute density per real-time power wattage, and storage density per real-time power wattage.

Figure 2:
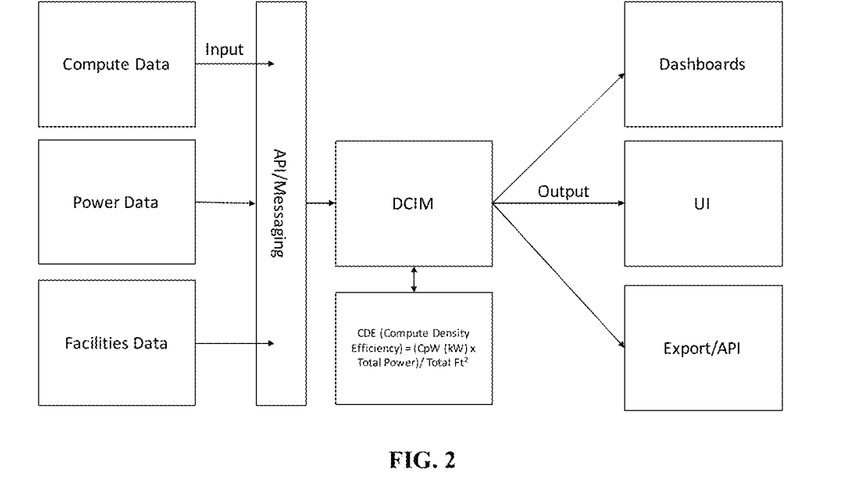
FIG. 2 illustrates a block diagram depicting data collection and compute density efficiency calculation in the DCIM system.

FIG. 2 illustrates a block diagram depicting data collection and compute density efficiency calculation in the DCIM system. With the compute data, power data and facilities data input into the DCIM system, the system estimates compute density per real-time power wattage, and storage density per real-time power wattage, and outputs the result to dashboards, networked User Interfaces and Export. According to an embodiment the Export could be presented in virtual reality and displayed on a smart phone, or other portable computing device.

According to an embodiment, the system is further configured to, based on the collected data center compute systems, power systems, and facility systems data, estimate a future compute systems condition, a future power systems condition, and a future facility systems condition as one type of Export showed in FIG. 2.

Figure 3:
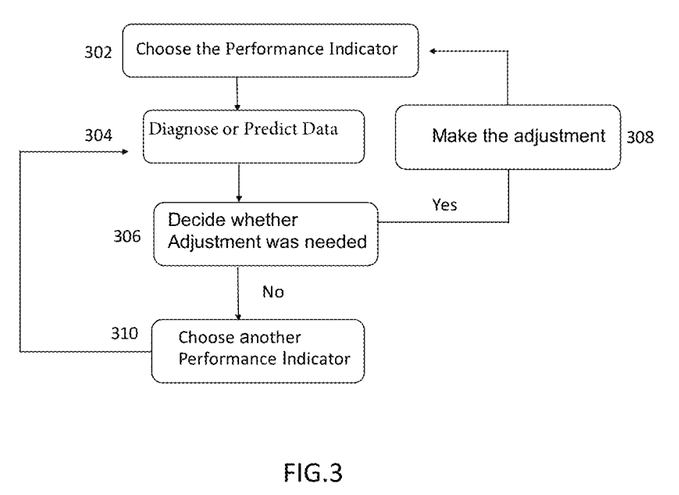
FIG. 3 depicts a logical view of the DCIM system according to an embodiment.

FIG. 3 illustrates via a flow diagram, the method of accommodating different metrics to adjust considering Performance Indicator to optimize the operation of the system. Step 302 includes choosing the considering Performance Indicator. In step 304, the related data is collected from the data center or predicted by the processor. In step 306, a decision is made based on the data aggregated in the memory from implemented machine learning to decide whether an adjustment or calibration is needed. Step 308 is implemented wherein an adjustment is made to the system. In the step 306 wherein the metric is optimal, the system proceeds to find or input manually another Performance Indicator and repeat the step 304 until the data center operation is optimized.

Figure 4:
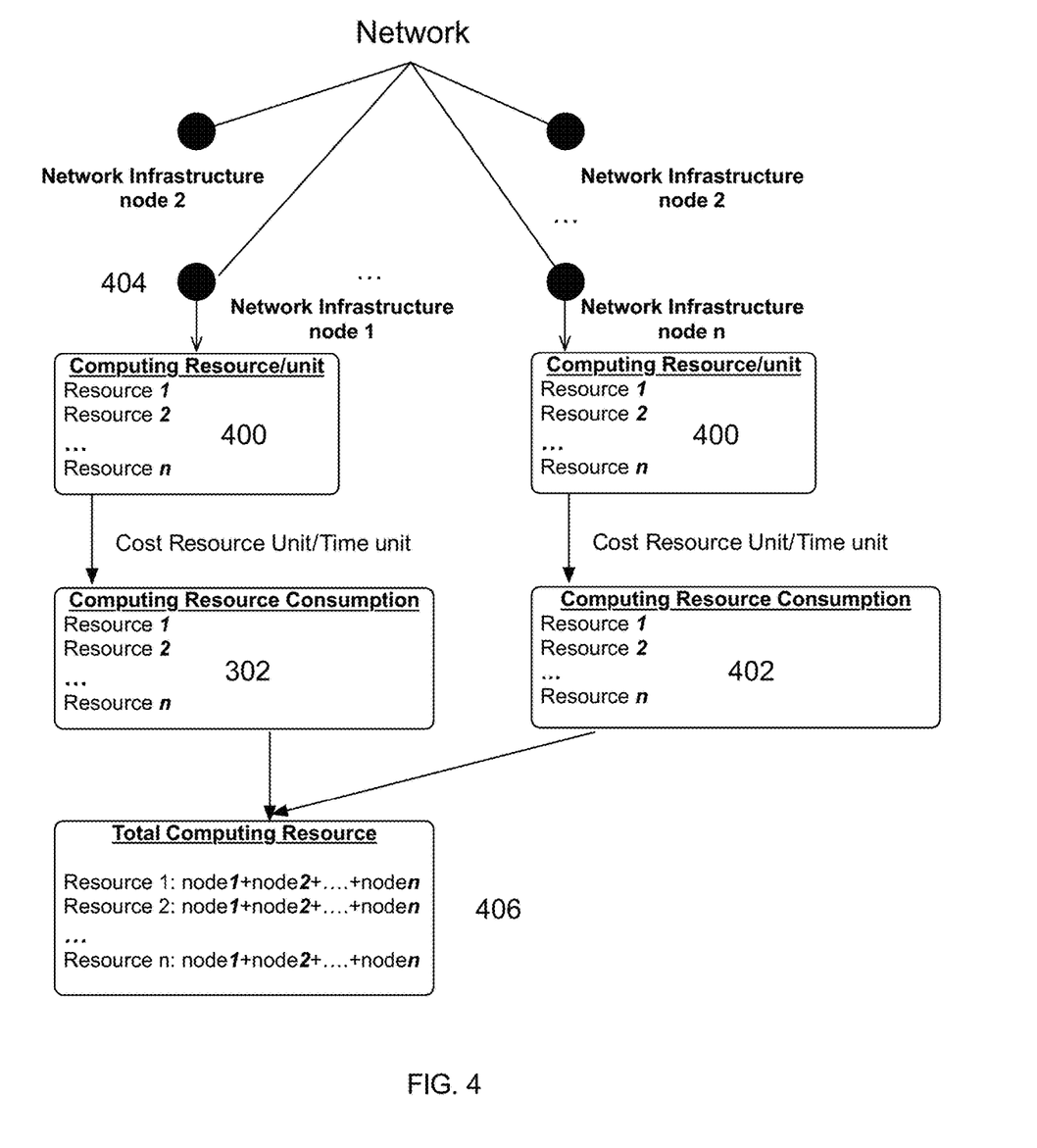
FIG. 4 depicts the system and method implementing complete computing resource consumption estimation over each node of a network of connected data centers.

FIG. 4 depicts the system and method implementing complete computing resource consumption estimation over each node of a network of connected data centers. Preferred embodiments implement Total Resource Utilization Efficiency (TRUE) optimizing not just compute resource consumption, but total efficiency of all components in a facility. According to the embodiment, the system is configured to: determine, for each compute system resource 400, a cost per predetermined time unit to deploy and operate the compute system resource, and to apply a cost conversion factor to each cost per predetermined time unit. Additionally, for each compute resource, the system generates an average number of resource units by averaging the number of resource units 402 over a plurality of network infrastructure nodes. And for an application executing on at least one of the network infrastructure nodes 404, the system generates a number of resource units used in a predetermined time period. Thus, the system can generate a total resource consumption 406 by adding the number of units consumed by the application in the predetermined time period for each compute resource.

Embodiments disclosed further enable systems and methods that allow easy scalability and accommodation of additional new metrics in the future, as they are defined.

Figure 5:
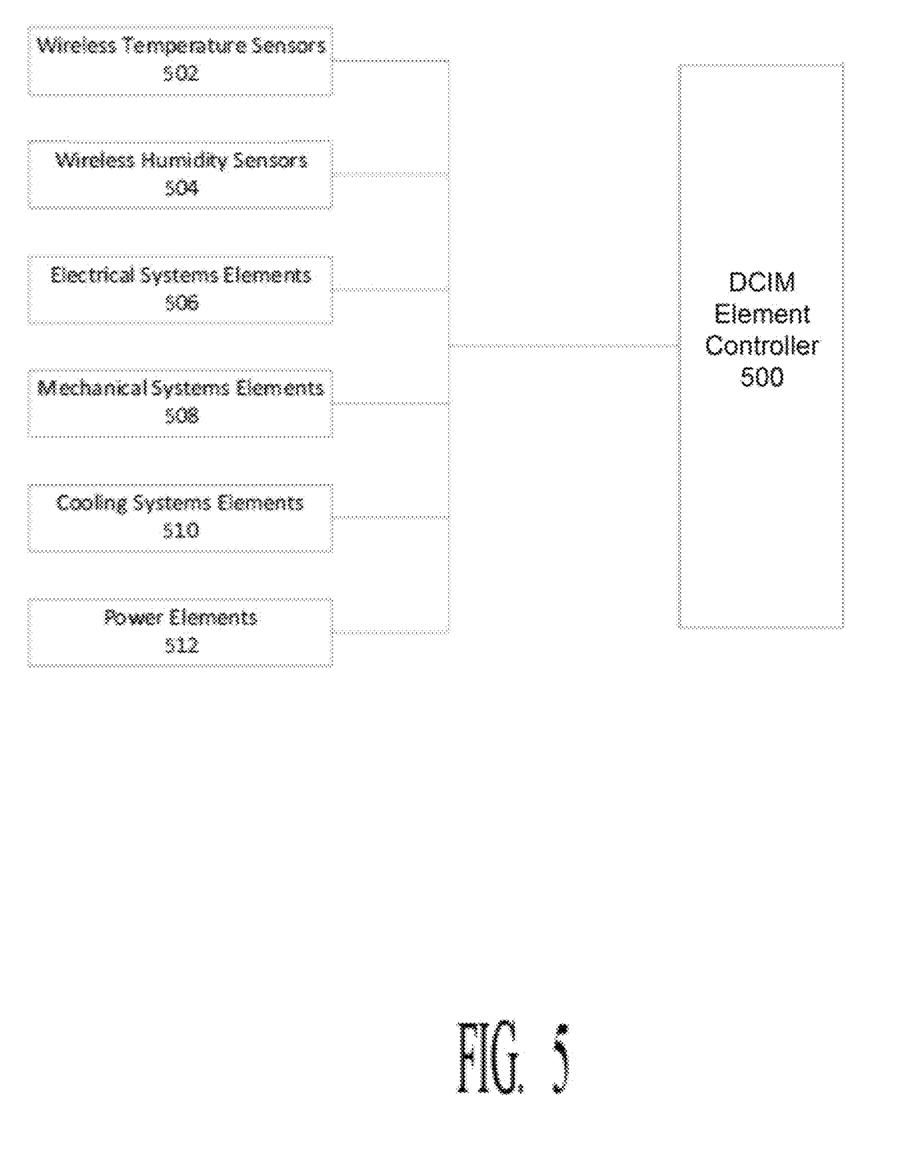
FIG. 5 illustrates another embodiment of the Data Center Infrastructure Management (DCIM) element controller logical view.

FIG. 5 illustrates an embodiment of the Data Center Infrastructure Management (DCIM) element controller logical view. The illustrated embodiment includes DCIM element controller 500, wireless temperature sensors 502, wireless humidity sensors 504, electrical systems elements 506, mechanical systems elements, and power elements 512.

Figure 6:
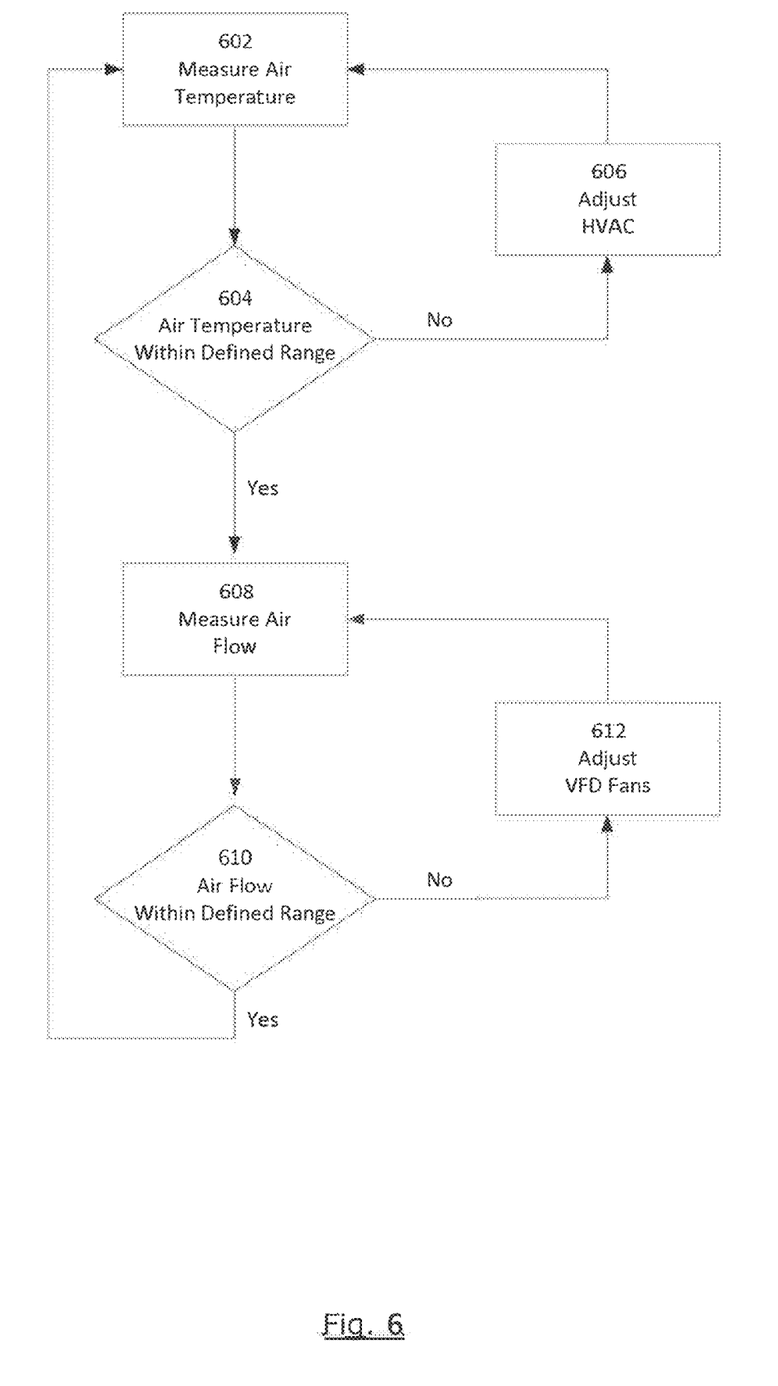
FIG. 6 depicts the process flow for managing infrastructure via the sample illustrated flowchart.

FIG. 6 depicts the process flow for managing infrastructure via the sample illustrated flowchart. Step 602 includes measuring air temperature. In step 604, a check is performed to evaluate whether the measured air temperature is within an acceptable range. If in step 604, the air temperature is not within the acceptable range, step 606 is implemented wherein the CRAC (Computer Room Air Conditioner), CDU (Coolant Distribution Unit) or/and RDHX (Rear Door Heat Exchanger) is/are adjusted to increase or lower the air temperature, as the case may be. If the air temperature is within the acceptable range, or after the air temperature is brought within the acceptable range, the next step 608, is performed wherein the air flow is measured and in step 610, the measured air flow is evaluated to check whether it is within an acceptable pre-defined range. Step 612 includes adjusting the (Variable Frequency Drive) fans to bring the air flow within the acceptable pre-defined range. Note that the above checks may be performed sequentially (as described) or alternatively, they may be performed simultaneously. Step 608 may include measuring water flow and in step 610 the measured water flow is evaluated to check if it is within a predefined range. Furthermore step 612 may include adjusting the VFD water pumps or automated, adjustable flow control valves to bring the water flow within an acceptable predefined range. Variations in prioritization of checks are possible, and in some instances, desirable, as would be apparent to a person having ordinary skill in the art.

A system for data center infrastructure management comprising a processing unit coupled to a memory element, and having instructions encoded thereon, wherein the encoded instructions cause the system to collect and store data center infrastructure system condition data, environmental condition data and component condition data; analyze the collected infrastructure system, environmental and component condition data; and based on the collected and analyzed data, automatically make zero or more adjustments to data center infrastructure system condition, environmental condition and component condition. The said analyzing further comprises predictive analytics configured for continuously collecting and analyzing data from the infrastructure system, the environment, and the said component or components. The said collecting further comprises collecting environmental data from a plurality of wireless sensors and collecting infrastructure system and component data from infrastructure elements wherein said infrastructure system and component data comprise collecting air temperature data and air flow data. The system is further caused to employ the analyzed data via a DCIM element controller, wherein the DCIM element controller comprises a means for configuring the infrastructure system and components' operational states for optimal efficiency, and wherein the configuring further comprises configuring based on analyzing if ambient air temperature is within a defined range. The configuring includes making zero (if ambient air temperature is within the defined range) or more (if ambient air temperature is not within the defined range) adjustments to the CRAC, CDU or/and RDHX to bring the ambient air temperature to within the defined range. Additionally, the configuring further comprises measuring ambient air flow data, and analyzing if the measured air flow is within a defined range, and making zero (if ambient air flow is within the defined range) or more (if ambient air flow is not within the defined range) adjustments to a single or plurality of VFD fans to bring the said air flow within the defined range. Additionally the configuring further comprises measuring water flow data and analyzing if the measured water flow is within acceptable predefined range and making zero or more adjustments to a single or plurality of VFD water pumps or automated, adjustable flow control valves to bring the said water flow within the defined range. According to an embodiment, the system is further caused to, via a presentation software module, allow display of the collected and analyzed data to a single or plurality of users. According to an additional embodiment the system is caused to allow access to the system over a secure network, and can access other systems via the said secure network.

According to an embodiment, the predictive analytics configured for continuously collecting and analyzing data, is further configured to implement predictive analytics of a single or plurality of virtual machines, an instance or instances over a cloud computing network, and demand for the said virtual machines and cloud instances, wherein the analytics for demand comprises: estimating a baseline of virtual machine or cloud demands based on collected real-time and historical demand data; estimating a baseline of virtual machine or cloud status based on collected real-time and historical demand data; predicting future status and demand based on predictive modeling which further comprises the collected real-time estimations; and based on the predictive modeling and analytics, dynamically implementing an action or actions. Thus, in an example embodiment, the disclosed predictive analytics is a key feature that not only enables monitoring infrastructure (electrical/cooling/mechanical) but also enables monitoring systems comprising virtual machines and entire cloud computing instances over a network. Predictive analytics for virtual machines and clouds allow the system to further leverage actionable analytics. For example based on real-time and historical data, a predictive analytics engine comprised in the system can predict when a cloud will be overrun with demand and dynamically add capacity.

Figure 7:
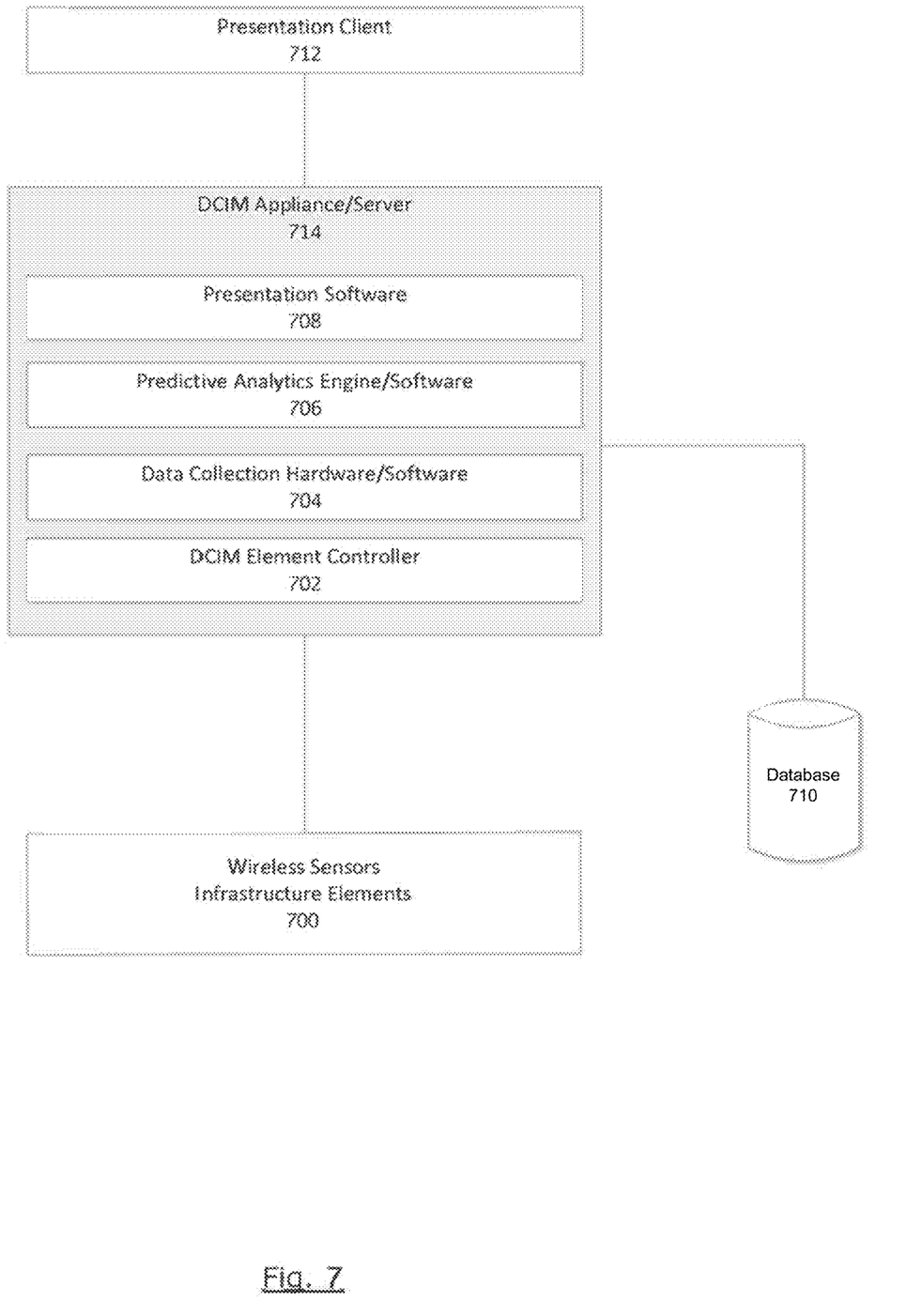
FIG. 7 depicts a logical view of the DCIM system according to an embodiment.

FIG. 7 depicts a logical view of the DCIM system according to an embodiment. The illustrated embodiment includes wireless sensors and infrastructure elements 700, DCIM element controller 702, data collection software 704, predictive analytics engine or software 706, presentation software 708, database 710, presentation client 712, and DCIM appliance or server 714.

The DCIM system comprising predictive analytics may comprise a plurality of DCIM appliances, or servers 714, which may be employed for hosting presentation software 708, predictive analytics engine or software 706, data collection software 704 and DCIM element controller software 702. The data collection software 704 is configured to continuously collect environmental data from a plurality of wireless sensors 700 and infrastructure system and component data from infrastructure elements 700. All of the collected data is stored in the database hardware 710. The predictive analytics engine or software 706 may be employed to analyze the stored data. The DCIM element controller 702 may be employed to issue operational state changes to infrastructure systems or components based on data that has been collected and analyzed. In one example, a wireless sensor measures air temperature 602, the data is analyzed to determine if the air temperature is within a defined range 604, if it is not within the defined range, the DCIM element controller may issue instructions to adjust the CRAC (Computer Room Air Conditioner), CDU or/and RDHX to bring the air temperature within the defined range. Then a wireless sensor 700 may measure air flow/pressure 604, the data is analyzed to find if the airflow/pressure is within the defined range, if it is not then the DCIM element controller 702 may issue instructions to adjust the VFD (Variable Frequency Drive) fans to bring the airflow/pressure within the defined range. Then a sensor may measure water flow with the data analyzed to find if the water flow is within the predefined range if it is not then the DCIM element controller may issue instructions to adjust the VFD water pumps or automated, adjustable flow control valves to bring the water flow within the defined range. Note that the above checks may be performed sequentially (as described) or alternatively, they may be performed simultaneously. Variations in prioritization of checks are possible, and in some instances, desirable, as would be apparent to a person having ordinary skill in the art.

The described DCIM system comprising predictive analytics may continuously collect and analyze data from a plurality of infrastructure systems, components and wireless sensors. A plurality of wireless sensors may be employed to continuously collect environmental data.

The data collected by the DCIM system may be stored in a database. The stored data may then be analyzed by the predictive analytics engine. The analyzed data may be employed by the DCIM element controller to manage infrastructure systems and components operational states to sustain optimal infrastructure efficiency.

In preferred embodiments, the predictive analytics configured for continuously collecting and analyzing data, and comprised in the DCIM, is further configured to collect and analyze data from a single or plurality of virtual machines, and an instance or instances over a cloud computing network. Additionally, the predictive analytics includes, estimating a demand for the said virtual machines and cloud instances, wherein the said estimating comprises: estimating a baseline of virtual machine or cloud demands based on collected real-time and historical demand data; estimating a baseline of virtual machine or cloud status based on collected real-time and historical demand data; predicting future status and demand based on predictive modeling which further comprises the collected real-time estimations; and based on the predictive modeling and analytics, dynamically implementing an action or actions. The DCIM element controller 702 may then be employed to issue operational state changes to infrastructure systems or components based on data that has been collected and analyzed.

The presentation software permits viewing of all the collected and analyzed data by an end user with the presentation client software. The DCIM system may be accessible and preferably, configurable over a secure IP network (not pictured). Additionally and alternatively, the DCIM system can control infrastructure elements, systems, components, virtual machines and cloud based instances, remotely, over a network.

In a system for data center infrastructure management comprising a processing unit coupled to a memory element, and having instructions encoded thereon, a method comprising, collecting and storing data center infrastructure system condition data, environmental condition data and component condition data, analyzing the collected infrastructure system, environmental and component condition data, and based on the collected and analyzed data, automatically making zero or more adjustments to data center infrastructure system condition, environmental condition and component condition.

According to an embodiment the analyzing is comprised in predictive analytics configured for continuously collecting and analyzing data from the infrastructure system, the environment, and the said component or components. The collecting further comprises collecting environmental data from a plurality of wireless sensors and collecting infrastructure system and component data from infrastructure elements wherein the said infrastructure system and component data comprise collecting air temperature data and air flow data.

An embodiment includes employing the analyzed data via a DCIM element controller, wherein the DCIM element controller comprises means for configuring the infrastructure system and components' operational states for optimal efficiency. Additionally, the said configuring further comprises configuring based on analyzing if ambient air temperature is within a defined range, and making zero (if the ambient air temperature is within the defined range) or more (if the ambient air temperature is not within the defined range) adjustments to the CRAC, CDU or/and RDHX to bring the ambient air temperature to within the defined range. According to additional embodiments the configuring further comprises measuring ambient air flow data, and analyzing if the measured air flow is within a defined range, and making zero (if the ambient air flow is within the defined range) or more (if the ambient air flow is not within the defined range) adjustments to a single or plurality of VFD fans to bring the said air flow within the defined range. According to additional embodiments the configuring further comprises measuring water flow data, and analyzing if the measured water flow is within a defined range, and making zero (if the water flow is within the defined range) or more (if the water flow is not within the defined range) adjustments to a single or plurality of VFD water pumps or automated, adjustable flow control valves to bring the said water flow within the defined range.

Embodiments disclosed further include in the method, via a presentation software module, allowing display of the collected and analyzed data to a single or plurality of users, and allowing access to, and preferably configuration of the system over a secure network.

Embodiments disclosed comprise a DCIM system software suite, a DCIM appliance or server used to install and run the DCIM system software suite, system elements and wireless sensors for collecting data from electrical, mechanical and cooling infrastructure systems or/and components. Preferred embodiments further include an intelligent predictive analytics engine to permit dynamic management of infrastructure systems or components.

Having described at least one embodiment of the present disclosure, various alterations, modifications and improvements will readily occur to those skilled in the art. Such alterations, modifications and improvements are intended to be within the scope and spirit of the disclosure. Accordingly, the foregoing description is by way of example only and is not intended to be limiting.

Preferred embodiments include a DCIM system including all hardware, software, system elements and wireless sensors described above. Ideally the system is highly configurable, wherein the database and predictive analytics engine can be configured for use in a multitude of scenarios that require analysis of collected data. Additionally, a presentation client and presentation interface that will be used to present data to end users is configurable according to various situations.

Embodiments of the system and method described may be employed by any field where it would be beneficial for systems or components to be dynamically managed based on defined data ranges and with a defined set of control commands/instructions that can be executed to change the operational state of the systems or components.

Further variations of embodiments of this invention are capable of continuously monitoring, collecting and analyzing data to automate management of virtual machine resources across a data center or data centers, on site or remotely, as would be apparent to a person having ordinary skill in the art.

Additionally, partial or complete embodiments of the disclosed invention can be utilized in alternate applications without departing from the scope and spirit of the disclosure. For example, DCIM systems and predictive analytics can be utilized to manage electrical, mechanical, cooling, and other crucial components, in commercial or residential buildings, factories, supermarkets, stores, and other resource consuming space including but not limited to buildings or dwellings, in an energy-efficient and cost-effective manner.

Embodiments disclosed provide systems and methods for efficient onsite and remote monitoring of infrastructure systems, efficient and accurate collection of data from the infrastructure systems and optionally automated management of these infrastructure systems to allow optimal efficiency of data center facilities and other such spaces.

Embodiments disclosed include dynamic real time management and control of infrastructure resources in data centers and other such facilities, resulting in increased efficiencies and lowered costs. Systems and methods disclosed provide for continuous data collection, real time data analysis and accurate forecasting for resource allocation through embodiments of the predictive analysis engine, module, and software.

Embodiments of the DCIM system comprising predictive analytics may be employed to continuously collect and analyze infrastructure system, component, and environmental data, identify inefficiencies or previously unknown interdependencies, and enable automated management of infrastructure systems and components to sustain optimal infrastructure efficiencies.

Embodiments enable increased productivity for data centers, as well as preventing the criteria from becoming outdated for modern data center demands. Additionally, embodiments disclosed enable critical decision making based on a real-time assessment, rather than historic based guesswork.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus it will be understood by those skilled in the art of infrastructure management, and more specifically automated infrastructure management especially pertaining to data centers, that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

The present invention and some of its advantages have been described in detail for some embodiments. It should be understood that although the system and process is described with reference to automated power management and optimization in data centers, and automated infrastructure management in waterborne datacenters, the system and process is highly reconfigurable, and may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A data center infrastructure management (DCIM) system configured to:
   over a network, collect data center compute systems, power systems, and facility systems data;
   trigger an action based on a diagnosed or predicted condition of the collected compute systems, power systems and facility systems;
   control via a compute, power, and facilities module, the compute systems, power systems and facility systems in the data center;
   wherein the control via the compute, power, and facilities module comprises calibrating the compute, power, and facility systems based on a determined compute requirement, and a corresponding determined associated power, cooling, and network data resource requirement;
   determine, for each compute system resource, a cost per predetermined time unit to deploy and operate the compute system resource; and wherein the determined compute requirement further comprises determining a compute density efficiency based on the corresponding determined associated power, cooling and network data resource requirement.

2. The system of claim 1, wherein the system is further configured to:
apply a cost conversion factor to each cost per predetermined time unit;
for each compute resource, generate an average number of resource units by averaging the number of resource units over a plurality of network infrastructure nodes;
for an application executing on at least one of the network infrastructure nodes, generate a number of resource units used in a predetermined time period; and
generate a total resource consumption by adding the number of units consumed by the application in the predetermined time period for each compute resource.

3. The system of claim 1, wherein the system is further configured to:
via a predictive analytics engine configured to communicate over the network, analyze and store collected operational data; and
based on the analyzed, collected operational data, automatically make zero or more adjustments to the compute systems, and based on adjustments to the compute systems, automatically make corresponding adjustments to the power systems, and to the facility systems.

4. The computer system of claim 1, wherein the system is further configured to:
based on the collected data center compute systems, power systems, and facility systems data, determine a future compute systems requirement, a corresponding associated future power systems requirement, and a future facility systems requirement.

5. In a data center infrastructure management (DCIM) system comprising a processing unit coupled to a memory element, and having instructions encoded thereon, a method comprising:
over a network, collecting data center compute systems, power systems, and facility systems data;
triggering an action based on a diagnosed or predicted condition of the collected compute systems, power systems and facility systems;
controlling via a compute, power, and facilities module, the compute systems, power systems and facility systems in the data center;
wherein the controlling via the compute, power, and facilities module comprises calibrating the compute, power, and facility systems based on a determined compute requirement, and a corresponding determined associated power, cooling, and network data resource requirement;
determining, for each compute system resource, a cost per predetermined time unit to deploy and operate the compute system resource;
and wherein the determined compute requirement further comprises determining a compute density efficiency based on the corresponding determined associated power, cooling and network data resource requirement.

6. The method of claim 5, further comprising:
applying a cost conversion factor to each cost per predetermined time unit;
for each compute resource, generating an average number of resource units by averaging the number of resource units over a plurality of network infrastructure nodes;
for an application executing on at least one of the network infrastructure nodes, generating a number of resource units used in a predetermined time period; and
generating a total resource consumption by adding the number of units consumed by the application in the predetermined time period for each compute resource.

7. The method of claim 5, further comprising:
via a predictive analytics engine configured to communicate over the network, analyzing and storing collected operational data; and
based on the analyzed, collected operational data, automatically making zero or more adjustments to the compute systems, and based on adjustments to the compute systems, automatically making corresponding adjustments to the power systems, and to the facility systems.

8. The method of claim 5, further comprising:
based on the collected data center compute systems, power systems, and facility systems data, determining a future compute systems requirement, a corresponding associated future power systems requirement, and a future facility systems requirement.

9. A Data Center Infrastructure Management (DCIM) system configured to:
determine a baseline criteria of virtual machine demands and status based on collected real-time and historical demand data;
predicting a future status and demand based on predictive modeling wherein the predictive modelling is based on the collected real-time and historical data;
based on the predictive modeling, dynamically implement an action or actions;
wherein the determined baseline criteria is based on a plurality of Performance Indicators comprising a determined compute density efficiency;
and wherein the Data Center Infrastructure Management (DCIM) system is configurable to accommodate scalable new Performance Indicators.

* * * * *

UNITED STATES PATENT AND TRADEMARK OFFICE
CERTIFICATE OF CORRECTION

PATENT NO. : 11,262,089 B2
APPLICATION NO. : 16/248770
DATED : March 1, 2022
INVENTOR(S) : Arnold Castillo Magcale Page 1 of 2

It is certified that error appears in the above-identified patent and that said Letters Patent is hereby corrected as shown below:

On the Title Page

Replace:
(63) Continuation of application No. 14/591,572, filed on Jan. 7, 2015, now abandoned, which is a continuation of application No. 15/283,097, filed on Sep. 30, 2016, now Pat. No. 10,216,606, which is a continuation of application No. 15/970,160, filed on May 3, 2018, now Pat. No. 10,673,684.

With:
(63) Continuation-in-Part of application No. 14/591,572, filed on Jan. 7, 2015, now abandoned, and is a continuation of application No. 15/283,097, filed on Sept. 30, 2016, now Pat. No. 10,216,606, and is a continuation-in-part of application No. 15/970,160, filed on May 3, 2018, now Pat. No. 10,673,684.

In the Specification

On Column 1, under CROSS REFERENCE TO RELATED APPLICATIONS:
Replace:
This application is a continuation of application Ser. No. 14/591,572 filed 7 Jan. 2015, entitled "A DATA CENTER INFRASTRUCTURE MANAGEMENT (DCIM) SYSTEM WITH PREDICTIVE ANALYTICS" which claims the benefit of provisional application No. 61/925,531 having a filing date of Jan. 9, 2014, and is further a continuation of application Ser. No. 15/283,097 filed 30 Sep. 2016 entitled "DATA CENTER MANAGEMENT SYSTEMS AND METHODS FOR COMPUTE DENSITY EFFICIENCY MEASUREMENTS" the contents of which are incorporated by reference in their entirety.

With:
This application is a continuation-in-part of application Ser. No. 14/591,572 filed Jan. 7, 2015, entitled "DATA CENTER INFRASTRUCTURE MANAGEMENT (DCIM) SYSTEM COMPRISING PREDICTIVE ANALYTICS" which claims the benefit of provisional application No. 61/925,531, filed Jan. 9, 2014, and is further a continuation of application Ser. No. 15/283,097 filed Sept. 30, 2016 entitled "DATA CENTER MANAGEMENT SYSTEMS AND METHODS FOR Signed and Sealed this
Twentieth Day of February, 2024

Katherine Kelly Vidal
*Director of the United States Patent and Trademark Office*

COMPUTE DENSITY EFFICIENCY MEASUREMENTS", now U.S. Patent No. 10,216,606, and is further a continuation-in-part of application Ser. No. 15/970,160 filed May 3, 2018, now U.S. Patent No. 10,673,684, each of which is incorporated by reference herein in its entirety.